(12) United States Patent
Wiesinger et al.

(10) Patent No.: US 10,969,451 B1
(45) Date of Patent: Apr. 6, 2021

(54) SYSTEMS AND METHODS FOR IN-PHASE ZERO ECHO TIME MAGNETIC RESONANCE IMAGING

(71) Applicant: GE Precision Healthcare LLC, Wauwatosa, WI (US)

(72) Inventors: Florian Wiesinger, Garching (DE); Mathias Engstrom, Stockholm (SE)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 16/578,677

(22) Filed: Sep. 23, 2019

(51) Int. Cl.
| G01R 33/48 | (2006.01) |
| G01R 33/44 | (2006.01) |
| G01R 33/36 | (2006.01) |
| G01R 33/561 | (2006.01) |
| G01R 33/385 | (2006.01) |

(52) U.S. Cl.
CPC ..... G01R 33/4828 (2013.01); G01R 33/3614 (2013.01); G01R 33/443 (2013.01); G01R 33/4816 (2013.01); G01R 33/4826 (2013.01); G01R 33/5615 (2013.01); G01R 33/385 (2013.01)

(58) Field of Classification Search
CPC ............ G01R 33/4828; G01R 33/4816; G01R 33/5615; G01R 33/3614; G01R 33/443; G01R 33/4826; G01R 33/385
See application file for complete search history.

(56) References Cited

U.S. PATENT DOCUMENTS

| 4,806,866 A | 2/1989 | Maier | |
| 6,794,867 B1* | 9/2004 | Block | ................ G01R 33/4828 324/307 |
| 2012/0119740 A1* | 5/2012 | Takahashi | .............. G01R 33/48 324/309 |
| 2019/0137586 A1 | 5/2019 | Wiesinger | |

* cited by examiner

*Primary Examiner* — G. M. A Hyder

(57) ABSTRACT

Systems and methods for ZTE MRI are disclosed. An exemplary method includes obtaining Larmor frequencies of water and/or fat for a region of interest of a subject to be imaged at a pre-scan and setting a center frequency for an RF transceiver of the MR system at a value between the Larmor frequencies of water and fat. A ZTE pulse sequence is applied to the subject and MR signals in response to the ZTE pulse sequence are received from the subject. The received MR signals are demodulated with the center frequency and an in-phase ZTE image is generated from the demodulated MR signals.

19 Claims, 7 Drawing Sheets

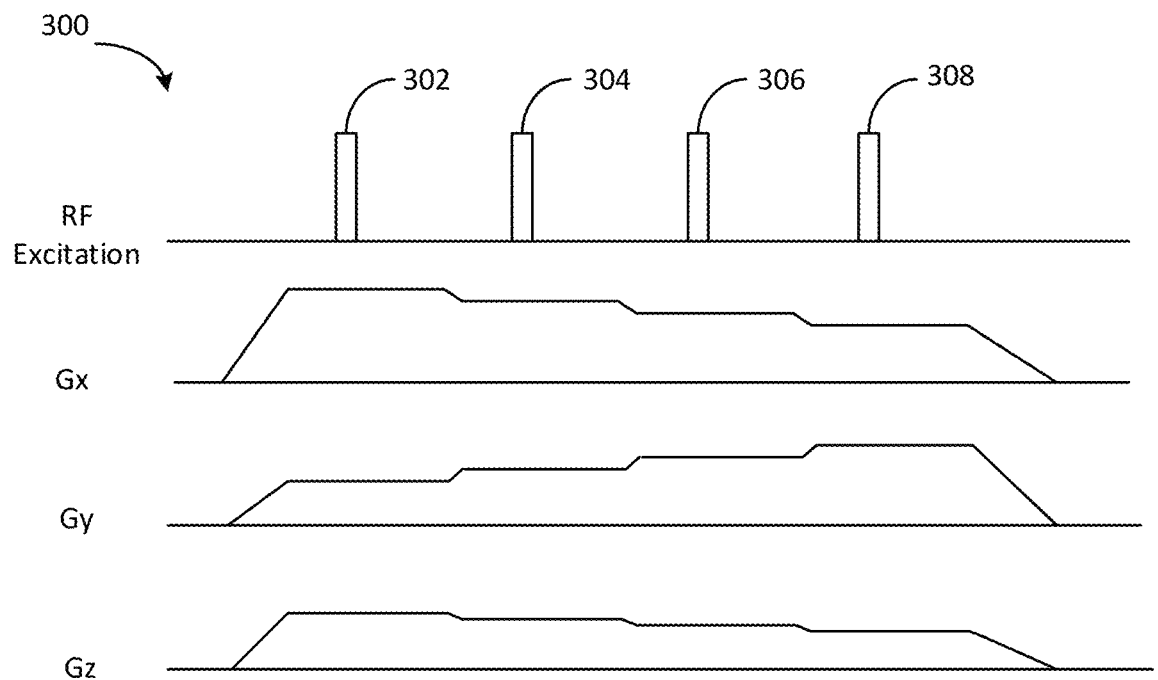
FIG. 3
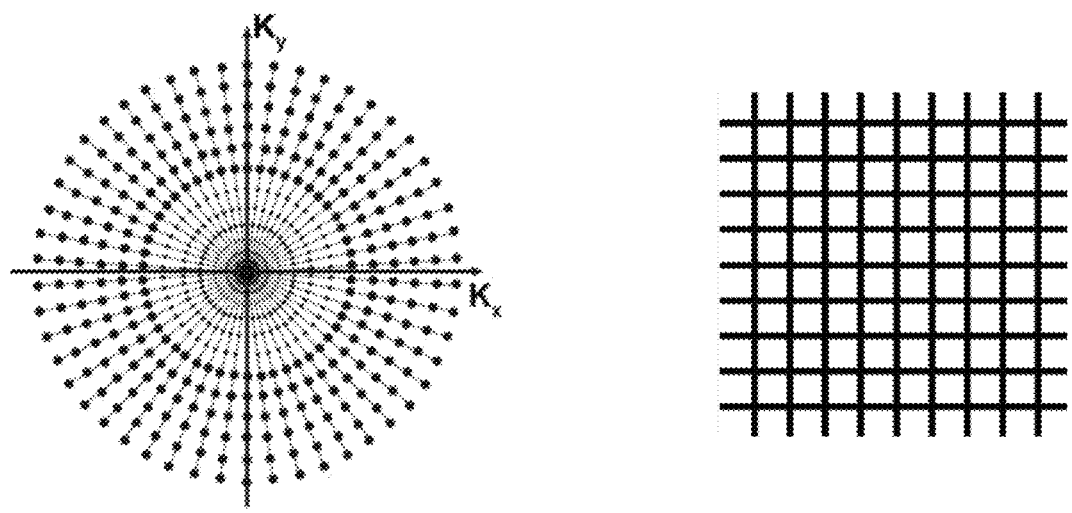
FIG. 4
FIG. 5

SYSTEMS AND METHODS FOR IN-PHASE ZERO ECHO TIME MAGNETIC RESONANCE IMAGING

FIELD

This disclosure relates to magnetic resonance imaging (MRI), and more particularly, to in-phase zero echo time (ZTE) MRI.

BACKGROUND

MM is a non-invasive diagnostic imaging tool based on the detection of protons in tissues, which can produce diagnostic images with high spatial resolution, strong soft tissue contrast and specificity, and good depth penetration. Imaging of hard tissues (e.g., bone and teeth) has been challenging because of low proton content in such tissues and ultrashort transverse relaxation times (i.e., T2). ZTE MM has been developed for hard tissues imaging and generally speaking, applications with a focus on tissues with very short T2 can potentially benefit from using ZTE MRI, including, for example, imaging of bone, teeth, cartilage, tendons, lung, etc.

ZTE MRI is a fast, robust, and silent approach for three-dimensional (3D) imaging of samples with ultrashort T2. In the method, spatial encoding and data acquisition are started as the MR signal is created and completed shortly thereafter. In particular, a short hard-pulse radio frequency (RF) excitation is used to produce a small flip angle. The RF excitation is applied while the encoding gradient is active so that a nominal echo time (TE) of zero is achieved. The ZTE acquisition uses 3D radial center-out k-space encoding wherein the encoding gradients in the three directions are gradually reoriented. A small step of changing gradient in three directions allows virtually silent MR imaging. Minimal gradient changes also reduce eddy current effects, making ZTE imaging highly robust. In addition, inverting the gray scale of ZTE images would result in computed tomography (CT) type image appearance. Therefore, ZTE imaging has found widespread applications including musculoskeletal (MSK) imaging, PET/MR attenuation correction, MR-guided radiation therapy planning, and so on (such as described in Zero TE MR bone imaging in the head, Wiesinger et al., *Magn Reson Med* 75: 107-114, 2016, Free-breathing, zero-TE MR lung imaging, Gibiino et al., *Magnetic Resonance Materials in Physics, Biology and Medicine* 28: 207-215, 2015, Zero TE-based pseudo-CT image conversion in the head and its application in PET/MR attenuation correction and MR-guided radiation therapy planning, Wiesinger et al., *Magn Reson Med* 80: 1440-1451, 2016, and In-phase zero TE musculoskeletal imaging, Engstrom et al, *Magn Reson Med* https://doi.org/10.1002/mrm.27928, 2019).

ZTE imaging is sensitive to chemical shift off-resonance signal interference, especially around fat-water tissue interfaces. Hydrogen atoms in fat have a lower Larmor frequency than those in water because each hydrogen atom in fat molecules is surrounded by many other atoms (e.g., carbon atoms) which effects the magnetic field. This difference in Larmor frequency is known as the chemical shift. Immediately after the excitation RF pulse, fat and water signals are in phase with each other, but due to the small chemical shift, fat and water signals begin to dephase. When fat and water are out of phase, voxels with a mixture of tissues may have a reduced signal since the fat signal subtracts from the water signal. This gives the characteristic dark outline at fat/water tissue interfaces, due to the mixed voxels at the edge. In addition, because the chemical shift displacement along the readout direction changes during acquisition, blur artifact may appear in the acquired MR image. In ZTE imaging, fat-water out-of-phase signals evolving during the 3D center-out radial readout may interfere with the dominant in-phase signals. The chemical shift artifacts may severely affect bone depiction as bone versus soft tissue difference critically depends on uniform, low-contrast soft tissue appearance.

The severity of the chemical shift artifacts depends on the imaging bandwidth and resolution: the lower the bandwidth, the worse the problem. Currently, high bandwidth has been used to address the artifacts. However, increasing the bandwidth may at the same time reduce the signal-to-noise ratio (SNR) in the image and limits the flip angle, thus it is not always desirable. As such, improved systems and methods for reducing chemical shift artifacts in ZTE imaging are generally desired.

SUMMARY

In one embodiment, the present disclosure provides a method for ZTE MM performed by a magnetic resonance (MR) system. The method comprises obtaining Larmor frequencies of water and/or fat for a region of interest of a subject to be imaged at a pre-scan; setting a center frequency for a radio frequency (RF) transceiver of the MR system at a value between the Larmor frequencies of water and fat; applying a ZTE pulse sequence to the subject; receiving MR signals in response to the ZTE pulse sequence from the subject; demodulating the received MR signals with the center frequency; and generating an in-phase ZTE image from the demodulated MR signals.

In another embodiment, the present disclosure provides an MRI system. The MRI system comprises a magnet configured to generate a static magnetic field; gradient coils configured to generate encoding gradients; an RF transceiver; and a processor connected to the magnet, the gradient coils, and the RF transceiver. The processor is configured to instruct the MRI system to perform a pre-scan to obtain Larmor frequencies of water and/or fat in the static magnetic field for a region of interest of a subject to be imaged at a pre-scan, and set a center frequency for the RF transceiver at a value between the Larmor frequencies of water and fat. The RF transceiver is configured to generate an RF excitation which is applied to the subject while encoding gradients are active, receive MR signals in response to the RF excitation from the subject, and demodulate the received MR signals with the center frequency.

In yet another embodiment, the present disclosure provides a method for processing magnetic resonance imaging (MRI) data performed by a computer system. The method comprises receiving k-space raw data obtained by zero echo time (ZTE) acquisition; demodulating the raw data with a frequency between Larmor frequencies of water and fat for a region of interest of an imaging subject; and generating an in-phase ZTE image from the demodulated raw data.

BRIEF DESCRIPTION OF THE DRAWINGS

Various aspects of this disclosure may be better understood upon reading the following detailed description and upon reference to the drawings in which:

FIG. 3 is a schematic graph of pulse sequence for ZTE imaging, in accordance with an exemplary embodiment;

FIG. 4 is a schematic graph showing radial center-out k-space sampling, in accordance with an exemplary embodiment;

FIG. 5 is a schematic graph showing k-space gridding, in accordance with an exemplary embodiment;

Figure 1:
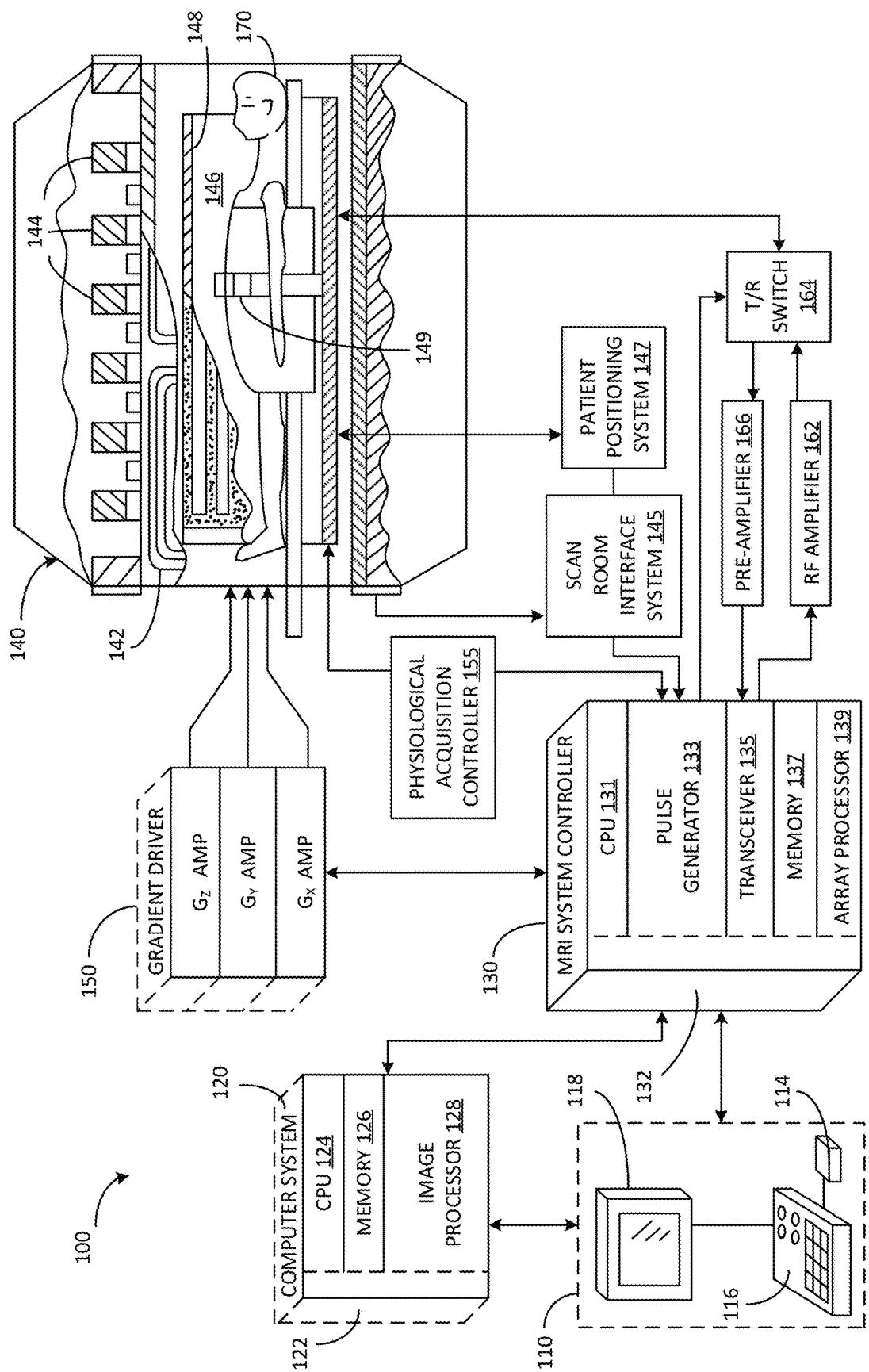
FIG. 1 is a schematic diagram of a magnetic resonance imaging (MRI) system, in accordance with an exemplary embodiment.

The drawings illustrate specific aspects of the described components, systems and methods for in-phase ZTE MRI. Together with the following description, the drawings demonstrate and explain the principles of the structures, methods, and principles described herein. In the drawings, the thickness and size of components may be exaggerated or otherwise modified for clarity. Well-known structures, materials, or operations are not shown or described in detail to avoid obscuring aspects of the described components, systems and methods.

DETAILED DESCRIPTION

One or more specific embodiments of the present disclosure are described below in order to provide a thorough understanding. These described embodiments are only examples of the systems and methods for in-phase ZTE MRI. The skilled artisan will understand that specific details described in the embodiments can be modified when being placed into practice without deviating the spirit of the present disclosure.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

Referring to the figures generally, the present disclosure describes systems and methods for in-phase ZTE MRI. ZTE MRI is a fast, robust, and silent approach for 3D imaging; especially suited for sampling ultrashort T2 structures. In the method, the RF excitation is applied while the encoding gradient is active so that a nominal TE of zero is achieved. 3D radial center-out k-space encoding is used wherein the encoding gradients in the three directions are gradually reoriented, which can reduce acoustic noise and reduce eddy current effects, making ZTE imaging quiet and robust. In ZTE acquisition, immediately after the excitation RF pulse, fat and water signals are in phase with each other, but due to the small difference in their Larmor frequencies (i.e., chemical shift), fat and water signals begin to dephase. The fat-water out-of-phase signals evolving during the 3D center-out radial readout start interfering with the dominant in-phase signals, resulting in blurring and destructive signal interference at fat/water tissue interfaces.

Currently, high bandwidth has been used to reduce chemical shift artifacts in ZTE imaging. However, increasing the bandwidth may reduce the SNR in the image and additionally requires extremely short RF pulses limiting the flip angle. U.S. patent application Ser. No. 15/802,767 (now published as US 2019/0137586) addresses the chemical shift artifacts by acquiring each 3D radial spoke at least twice with varying readout gradient amplitude and hence varying effective sampling time. Using k-space based chemical shift decomposition, the acquired data is then reconstructed into an in-phase ZTE image and an out-of-phase disturbance. This approach requires pulse sequence and image reconstruction modifications and increases scan time.

The method disclosed herein addresses the chemical shift artifacts by adjusting a frequency used to demodulate acquired MR signals. In particular, the frequency for demodulation is set at a value between the Larmor frequencies of water and fat for a region of interest of a subject to be imaged. For example, for an MRI system with 1.5 tesla (T) magnetic field, the frequency for demodulation is about 110 Hz lower than the Larmor frequency of water while about 110 Hz higher than the Larmor frequency of fat. For an MRI system with 3 T magnetic field, the frequency is about 220 Hz lower than the Larmor frequency of water while about 220 Hz higher than the Larmor frequency of fat. In some embodiments, the frequency for demodulation may be adjusted by, for example, setting a center frequency for an RF transceiver of an MRI system at the desired value during pre-scan. In some embodiments, the frequency for demodulation may be set at the desired value at the time of post-processing acquired raw data. ZTE images (e.g., 3D bone and lung images) obtained according to the method disclosed herein demonstrate exceptional soft-tissue uniformity, as required by body, MSK, PET/MR and RTP applications.

Referring now to FIG. 1, a schematic diagram of an exemplary MRI system 100 is shown in accordance with an exemplary embodiment. The operation of MRI system 100 is controlled from an operator workstation 110 which includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The computer system 120 may include a central processing unit (CPU) 124, a memory 126, and an image processor 128. In some embodiments, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130.

The MRI system controller 130 includes a set of components in communication with each other via electrical and/or data connections 132. The MRI system controller connections 132 may be direct wired connections, fiber optic connections, wireless communication links, or the like. The MRI system controller 130 may include a CPU 131, a pulse generator/sequencer 133 communicating with the operator workstation 110, a transceiver (or RF transceiver) 135, a memory 137, and an array processor 139. In some embodiments, the pulse generator/sequencer 133 may be integrated into a resonance assembly 140 of the MRI system 100. The MRI system controller 130 may receive commands from the operator workstation 110 to indicate the MM scan sequence to be performed during an MRI scan. The MRI system controller 130 is also coupled to and communicates with a gradient driver system 150, which is coupled to a gradient coil assembly 142 to produce magnetic field gradients during an MRI scan.

The pulse generator/sequencer 133 may also receive data from a physiological acquisition controller 155 which receives signals from a plurality of different sensors connected to an object or patient 170 undergoing an MM scan, such as electrocardiography (ECG) signals from electrodes attached to the patient. And finally, the pulse generator/sequencer 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a patient table to a desired position for an MRI scan.

The MRI system controller 130 provides gradient waveforms to the gradient driver system 150, which includes, among others, Gx, Gy and Gz amplifiers. Each Gx, GY and Gz gradient amplifier excites a corresponding gradient coil in the gradient coil assembly 142 to produce magnetic field gradients used for spatially encoding MR signals during an MRI scan. The gradient coil assembly 142 is included within the resonance assembly 140, which also includes a superconducting magnet having superconducting coils 144, which in operation, provides a static homogenous longitudinal magnetic field $B_0$ throughout a cylindrical imaging volume 146 that is enclosed by the resonance assembly 140. The resonance assembly 140 also includes a RF body coil 148 which in operation, provides a transverse magnetic field $B_1$ that is generally perpendicular to $B_0$ throughout the open cylindrical imaging volume 146. The resonance assembly 140 may also include RF surface coils 149 used for imaging different anatomies of a patient undergoing an MRI scan. The RF body coil 148 and RF surface coils 149 may be configured to operate in a transmit and receive mode, transmit mode, or receive mode.

A subject or patient 170 undergoing an MRI scan may be positioned within the cylindrical imaging volume 146 of the resonance assembly 140. The transceiver 135 in the MRI system controller 130 produces RF excitation pulses that are amplified by an RF amplifier 162 and provided to the RF body coil 148 through a transmit/receive switch (T/R switch) 164.

As mentioned above, RF body coil 148 and RF surface coils 149 may be used to transmit RF excitation pulses and/or to receive resulting MR signals from a patient undergoing an MRI scan. The resulting MR signals emitted by excited nuclei in the patient undergoing an MRI scan may be sensed and received by the RF body coil 148 or RF surface coils 149 and sent back through the T/R switch 164 to a pre-amplifier 166. The T/R switch 164 may be controlled by a signal from the pulse generator/sequencer 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode.

In some embodiments, the resulting MR signals sensed and received by the RF body coil 148 or RF surface coil 149 and amplified by the pre-amplifier 166 are stored as an array of raw k-space data in memory 137 for post-processing. An MR scan is complete when the array of raw k-space data, corresponding to the received MR signals, has been acquired and stored temporarily in the memory 137 until the data is subsequently transformed to create images.

In some embodiments, the MR signals sensed and received by the RF body coil 148 or RF surface coil 149 and amplified by the pre-amplifier 166 are demodulated, filtered and digitized in the receive section of the transceiver 135 and transferred to the memory 137 in the MRI system controller 130. This data is rearranged into separate k-space data arrays for each image to be reconstructed, and each of these separate k-space data arrays is input to the array processor 139, which operates to Fourier transform the data into arrays of image data.

The array processor 139 uses a transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118.

In various embodiments, the components of computer system 120 and MRI system controller 130 may be implemented on the same computer system or a plurality of computer systems. It should be understood that the MRI system 100 shown in FIG. 1 is for illustration. An appropriate MRI system may include more, fewer, and/or different components.

Figure 2:
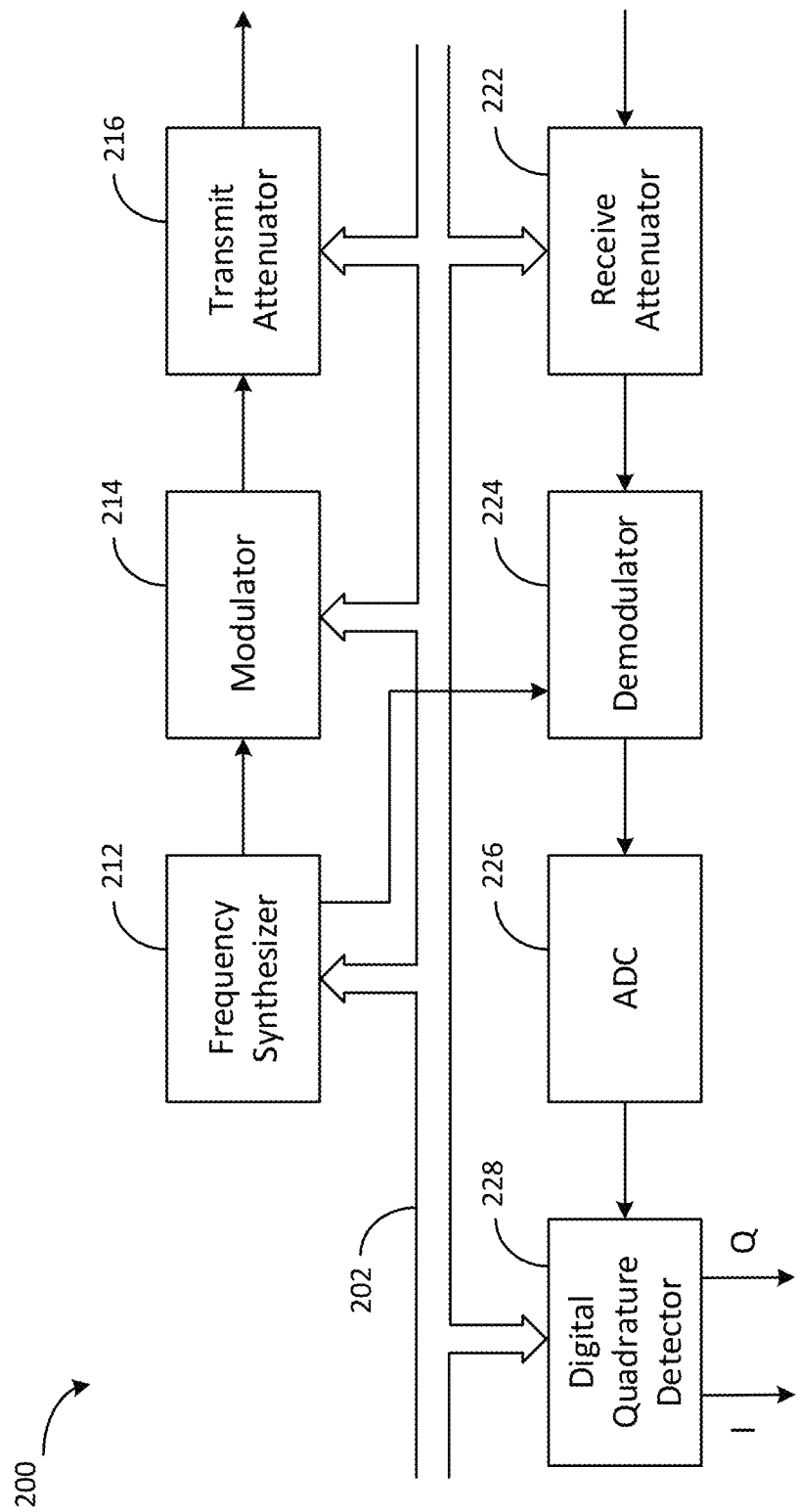
FIG. 2 is a schematic diagram of a radio frequency (RF) system for an MRI system, in accordance with an exemplary embodiment.

Referring to FIG. 2, a schematic diagram of an RF system 200 for an MRI system (e.g., MRI system of FIG. 1) is shown, in accordance with an exemplary embodiment. The RF system 200 may correspond to the transceiver 135 in FIG. 1. The RF system 200 includes a transmit section for transmitting the RF excitation pulses and a receive section for receiving MR signals. The transmit section includes frequency synthesizer 212, modulator 214, and transmit attenuator 216. The receive section includes receive attenuator 222, demodulator 224, analog-to-digital converter 226, and digital quadrature detector 228. The RF system 200 is coupled to other components of the MRI system controller (e.g., MRI system controller 130 in FIG. 1) via a link 202. The link 202 may correspond to the electrical/data connection 132 in FIG. 1.

The transmit section of RF system 200 is configured to generate RF pulses with appropriate center frequencies, bandwidths, amplitudes, and phases in order to excite nuclei within desired slices of the subject (e.g., the patient 170 in FIG. 1). To generate the RF pulse, the frequency synthesizer 212 receives a set of digital signals from CPU (e.g., CPU 131 of FIG. 1) and pulse generator (e.g., pulse generator 133 of FIG. 1) via the link 202 and produces an RF carrier wave accordingly. The set of digital signals indicate the frequency and phase of the RF carrier wave. The RF carrier wave is applied to the modulator 214 which modulates the amplitude of the RF carrier wave according to a signal received through the link 202. This signal defines the envelop, and therefore, the bandwidth, of the RF excitation pulse to be produced. The modulated RF excitation pulse is applied to the transmit attenuator 216 which attenuates the pulse according to a digital command received through the link 202. The attenuated RF excitation pulse is applied to a power amplifier (e.g., RF amplifier 162 in FIG. 1) which drives the RF coil (e.g., RF body coil 148 in FIG. 1).

MR signals produced by the subject (e.g., patient 170 in FIG. 1) are picked up by the receiver coil (e.g., RF body coil 148 or RF surface coils 149 of FIG. 1), amplified by a pre-amplifier (e.g., pre-amplifier 166 in FIG. 1) and applied to the input of the receive attenuator 222. The receive attenuator 222 attenuates the MR signals by an amount determined according to a digital attenuation signal received through the link 202. The MR signals contain a narrow frequency range of interest (e.g., ±16 kHz) embedded in or carried by the RF carrier wave at or around the Larmor frequency. The signals are both amplitude-modulated and phase-modulated. Signal intensity is contained in the amplitude-modulated portion while spatial location in the phase-modulated portion of the wave. This embedded information is extracted through the process of demodulation in the demodulator 224. Demodulation refers to multiplication of the signal by sinusoid or cosinusoid with a frequency at or near the Larmor frequency. The demodulator 224 receives a clean copy of the RF carrier wave directly from the frequency synthesizer 212 and mixes it with the MR signal to extract the useful information. In some embodiments, one or more low pass filters (not shown in current figures) are used to remove the high frequency carrier wave components following the demodulation. The demodulated (and filtered) MR signals are applied to the analog-to-digital converter (ADC) 226 where they are converted to digital signals. The output of the ADC 226 is applied to the digital quadrature detector 228, which produces in-phase (I) values and quadrature (Q) values representing the real and imaginary components of the received MR signal. The resulting stream of digitized I and Q values of the received MR signal is output to the array processor (e.g., array processor 139 of FIG. 1) where they are employed to reconstruct an image.

In some embodiments, MR signals produced by the subject are picked up by the receiver coil and amplified by a pre-amplifier but are not processed by the receive section of the RF system 200. Rather, the MR signals are stored in a memory (e.g., memory 137 in FIG. 1) as raw k-space data. A separate computer system, such as an image workstation, may read the raw data from the memory and reconstruct MR images. In some embodiments, this computer system combines functions performed by the receive section of the RF system 200 and the array processor 139, including attenuation, demodulation (and filter), ADC, digital quadrature, Fourier transform, among others. However, the demodulation at the post-processing operation does not use a copy of the RF carrier wave generated by the transmit section of the RF system 200 (e.g., by frequency synthesizer 212), but generates a wave on its own. The frequency of the wave may be the same as or different than the frequency of RF carrier wave generated by the transmit section of the RF system 200. In some embodiments, the raw MR signals are converted to digital signals first, followed by digital demodulation, and so on.

Referring to FIG. 3, a schematic graph of a pulse sequence 300 for ZTE imaging is shown, in accordance with an exemplary embodiment. In the pulse sequence 300, the RF excitation may be produced by the transceiver (e.g., transceiver 135 in FIG. 2, RF system 200 in FIG. 2), RF amplifier (e.g., RF amplifier 162 in FIG. 1), and transmit coil (e.g., RF body coil 148). The encoding gradients in three directions (i.e., Gx, Gy, and Gz) may be produced by the gradient driver (e.g., gradient driver system 150 in FIG. 1) and the gradient coils (e.g., gradient coil assembly 142 in FIG. 1).

The ZTE pulse sequence shown in FIG. 3 is based on the Rotating Ultra-Fast Imaging Sequence (RUFIS). First, the encoding gradients in three directions (i.e., Gx, Gy, and Gz) are ramped to the desired amplitudes and remain constant until adjusted for the next repetition. In the presence of the encoding gradients, a short, non-selective hard-pulse RF excitation (e.g., 302, 304, 306, 308) is applied to produce a small flip angle. In other words, the encoding gradients are set before excitation of a high bandwidth and thus short, hard RF pulse. In this way, gradient encoding starts instantaneously upon signal excitation, resulting in a nominal echo time (TE) of zero (hence, referred to as ZTE). For uniform excitation independent of the readout direction, the excitation bandwidth needs to encompass the imaging bandwidth, requiring extremely short, hard pulse RF excitation of a few micro-seconds duration and correspondingly high RF excitation bandwidth of a few kilo-hertz, for example.

ZTE imaging employs 3D radial center-out k-space acquisition and FIG. 4 shows the radial spokes in kx-ky plane for illustration. In some embodiments, the radial spokes are sequentially ordered along a spiral path, resulting in a uniform sampling of the 3D k-space, as described in "A Strategy for sampling on a sphere applied to 3D selective RF pulse design", Wong et al., *Magn Reson Med* 32: 778-784, 1994. Alternatively, the 3D radial spokes can be arranged along other trajectories, such as spiral phyllotaxis patterns, as described in "Spiral phyllotaxis: The natural way to construct a 3D radial trajectory in MRI," Piccini et al., *Magn Reson Med* 66: 1049-1056, 2011. As such, the encoding gradients are not ramped down but gradually reoriented between repetitions. Virtually silent gradient operation can be achieved by employing the gradients in a continuous mode and keeping amplitude changes small by selecting successive radial directions on a spiral-shaped path on the surface of a sphere. Minimal gradient changes also reduce eddy current effects, making ZTE imaging highly robust. In some embodiments, the ZTE readout is segmented into a plurality of spokes per segment for optional magnetization preparation using e.g. T1, T2, or arteria spin labeling preparation. The receive section of the RF system (e.g., RF system 200 in FIG. 2) demodulates a narrow range of useful frequencies from the much higher carrier signal at or around Larmor frequency.

When the k-space is filled through the 3D radial center-out sampling, the acquired k-space data may be transformed by gridding, as shown in FIG. 5, followed by Fourier transform to form a 3D MR diagnostic image. In some embodiments, at least a portion of the k-space may be undersampled or oversampled and various approaches may be used to reconstruct the image from the acquired k-space data, as known in the art.

It should be understood that the schematic pulse sequence shown in FIG. 3 is for illustration not for limitation. Any appropriate ZTE pulse sequence can be used for acquisition. Examples of different pulse sequences for ZTE acquisition includes RUFIS (such as described in Ultra-Fast Imaging Using Low Flip Angles and FIDs, Madio et al., *Magn Reson Med* 34: 525-529, 1995), back-projection reconstructed low angle shot (BLAST) sequence (such as described in Fast Imaging in Liquids and Solids with the Back-projection Low Angle ShoT (BLAST) Technique, Hafner, *Magn Reson Imaging*, 12: 1047-1051, 1994), water- and fat-suppressed proton projection MRI (WASPI) sequence (such as described in Density of organic matrix of native mineralized bone measured by water and fat suppressed proton projection MRI, Wu et al., *Magn Reson Med* 50: 59-68, 2003), Zero TE sequence (such as described in MRI with Zero Echo Time: hard versus Sweep Pulse Excitation, Weiger et al., *Magn Reson Med* 66: 379-389, 2011), pointwise encoding time reduction with radial acquisition (PETRA) (such as described in Ultrashort echo time imaging using pointwise encoding time reduction with radial acquisition (PETRA), Grodzki et al., *Magn Reson Med* 67: 510-518, 2012), or ramped hybrid encoding (RHE) (such as described in Ramped hybrid encoding for improved ultrashort echo time imaging, Jang et al., *Magn Reson Med* 76: 814-825, 2016).

As known in the art, hydrogen atoms in fat have a lower Larmor frequency than those in water. This difference in Larmor frequency is known as the chemical shift which is quoted in parts per million (ppm). The frequency difference is calculated by multiplying the chemical shift in ppm by the resonant frequency in megahertz of protons at a particular magnetic field strength. The chemical shift between fat and water is ~3.5 ppm. At 1.5 T magnetic field, protons have a Larmor frequency of 63.87 MHz, so the frequency difference is approximately 220 Hz; while at 3 T protons have a Larmor frequency of 127.74 MHz, thus the frequency difference is approximately 440 Hz.

Strictly speaking, zero echo time (i.e., TE=0) is valid only for the central k-space samples (i.e., k=0) where fat and water signals are perfectly aligned and in-phase. The effective echo time of the k-space sample increases linearly with the distance from the k-space center along the 3D center-out radial spoke. Later k-space samples are affected by undesired fat-water chemical shift out-of-phase contributions. More specifically, the accumulation of fat-water out-of-phase contribution varies with the effective echo time of the k-space sample. Take the magnetic field strength of 3 T as an example. The fat-water frequency difference of ~440 Hz corresponds to in-phase echo time of 0, 2.3 ms (1/440 Hz), 4.6 ms (2/440 Hz), and so on, and out-of-phase echo times of 1.15 ms (0.5/440 Hz), 3.45 ms (1.5/440 Hz), 5.75 ms (2.5/440 Hz), and so on.

In existing ZTE acquisition methods, the center frequency of the RF transceiver (e.g., transceiver 135 in FIG. 1, RF system 200 in FIG. 2) is set at the Larmor frequency of water. The present disclosure changes the center frequency of the RF transceiver to a value between the Larmor frequencies of water and fat. In some embodiments, the center frequency is set at a value corresponding to the midpoint of the fat and water Larmor frequencies. That is to say, the center frequency is about 220 Hz lower than the Larmor frequency of water (while about 220 Hz higher than the Larmor frequency of fat) for 3 T magnetic field, or about 110 Hz lower than the Larmor frequency of water (while about 110 Hz higher than the Larmor frequency of fat) for 1.5 T magnetic field. In some embodiments, the center frequency is set at a value substantially corresponding to the midpoint, for example, in a range of midpoint frequency ±25% of the difference of Larmor frequencies of water and fat.

Figure 6:
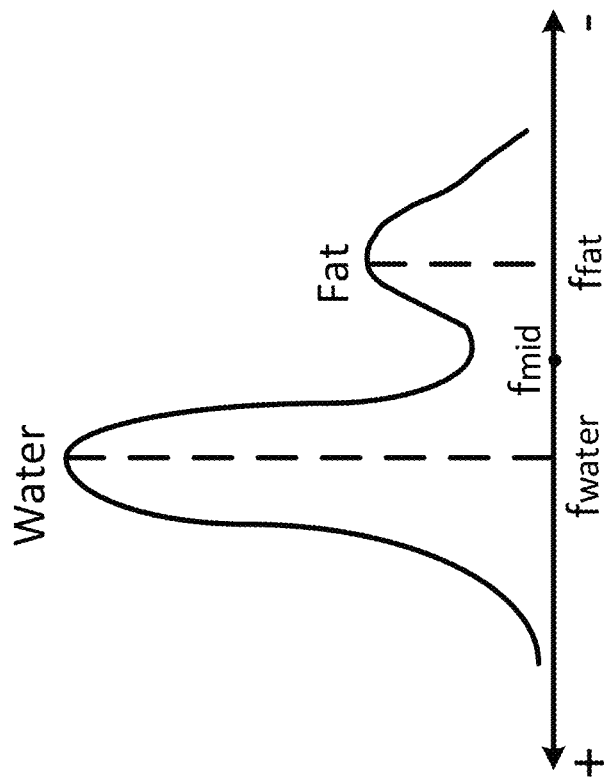
FIG. 6 is a schematic graph showing Larmor frequencies for water and fat, in accordance with an exemplary embodiment.

In some embodiments, the center frequency of the RF transceiver can be adjusted at the pre-scan operation. Usually a pre-scan is performed before each MR imaging sequence, in which the characteristics of the RF transceiver are optimized. Since the presence of the patient within the magnet may alter the precessional frequency very slightly, the pre-scan operation involves determining the exact Larmor frequency so that the appropriate offsets can be calculated. Any appropriate pre-scan sequence known in the art may be used to determine the precise Larmor frequency for the region of interest in the subject to be imaged. As an example, U.S. Pat. No. 4,806,866 describes a pre-scan sequence for measuring Larmor frequencies. The MR signal in response to the pre-scan sequence may be processed to produce a graph of signal amplitude versus RF frequency. FIG. 6 shows an example of such graph. In FIG. 6, a frequency $f_{water}$ corresponding to the peak amplitude of water signal is determined to be the Larmor frequency of water while a frequency $f_{fat}$ corresponding to the peak amplitude of fat signal is determined to be the Larmor frequency of fat.

In some embodiments, an operator of the MR system may examine the graph and manually adjust the center frequency of the RF transceiver to a desired value via an operator workstation (e.g., operator workstation 110 in FIG. 1). For example, the desired value may be a frequency $f_{mid}$ midway between the water and fat Larmor frequencies $f_{water}$ and $f_{fat}$. In some embodiments, the operator may select an "in-phase" option via the operation workstation, and the MR system, in response to the option, calculates the desired value of the center frequency. In some embodiments, only one of the Larmor frequency of water $f_{water}$ and the Larmor frequency of fat $f_{fat}$ is determined at pre-scan. The center frequency $f_{mid}$ can be obtained via known formula, for example, $f_{mid}=f_{water}-110$ Hz or $f_{mid}=f_{fat}+110$ Hz for 1.5 T; or $f_{mid}=f_{water}-220$ Hz or $f_{mid}=f_{fat}+220$ Hz for 3 T. The center frequency can be displayed to the operator with other ZTE acquisition parameters, including, for example, flip angle α, imaging bandwidth (BW), field of view (FOV), isotropic resolution, number of spokes, number of spokes per segments, etc., as shown in Table 1 below.

TABLE 1

|  | f | α | BW | FOV | Resolution | Spokes/segment |
|---|---|---|---|---|---|---|
| Default | $f_{mid}$ | 1.2° | ±62.5 kHz | 260 mm | 1.35 mm | 512 ... |
| High res | $f_{mid}$ | 1.2° | ±62.5 kHz | 220 mm | 0.85 mm | 512 ... |

After the operator confirms the configuration, an MR diagnostic scan may be performed accordingly. In particular, the adjusted center frequency $f_{mid}$ is used to generate the RF carrier wave (e.g., at frequency synthesizer 212 in FIG. 2). The ZTE pulse sequence (e.g., pulse sequence 300 in FIG. 3) having the parameters in Table 1 is applied. Responding MR signals are received and demodulated (e.g., at demodulator 224 in FIG. 2). The wave for demodulation is a copy of the RF carrier wave and thus the frequency for demodulation is the adjusted center frequency, $f_{mid}$. The demodulated MR signals may be reconstructed to generate in-phase ZTE images, using any appropriate reconstruction approaches.

The bandwidth at the transmit side is much higher than the bandwidth at the receive side as hard pulses are used. Therefore, the effect of changing the center transmit frequency is negligible comparing to the effect of changing the center receive frequency (i.e., the frequency for demodulation). As such, in some embodiments, the frequency for demodulation may be adjusted at post-processing rather than at pre-scan. In particular, at the pre-scan, the Larmor frequencies of water and/or fat for the region of interest of the subject are determined. The Larmor frequency of water $f_{water}$ is used as the center frequency for the transceiver and used along with other parameters for the ZTE acquisition, as shown in Table 2.

TABLE 2

| | f | α | BW | FOV | Resolution | Spokes/segment |
|---|---|---|---|---|---|---|
| Default | $f_{water}$ | 1.2 | ±62.5 kHz | 260 mm | 1.35 mm | 512 . . . |
| High res | $f_{water}$ | 1.2 | ±62.5 kHz | 220 mm | 0.85 mm | 512 . . . |

The ZTE pulse sequence (e.g., pulse sequence 300 in FIG. 3) having the parameters in Table 2 is applied and responding MR signals are received (e.g., at RF surface coils 149 in FIG. 1) and amplified (at pre-amplifier 166 in FIG. 1). the MR signals are then stored in a memory (e.g., memory 137 in FIG. 1) as raw k-space data. Post-processing may be performed on the raw k-space data to construct MR images. During the post-processing, the raw data may be demodulated, among other processes. For demodulation, the raw data is multiplied by sinusoid or cosinusoid with the frequency $f_{mid}$. In other words, the frequency for modulation has a value between the Larmor frequencies of water and fat, although the center frequency used in acquisition is the Larmor frequency of water. The post-processing demodulation does not use a copy of the RF carrier wave generated by the transmit section of the RF system 200 (e.g., by frequency synthesizer 212), but uses a different frequency. The demodulated MR signals may be reconstructed to generate in-phase ZTE images, using any appropriate reconstruction approaches.

Figure 7B:
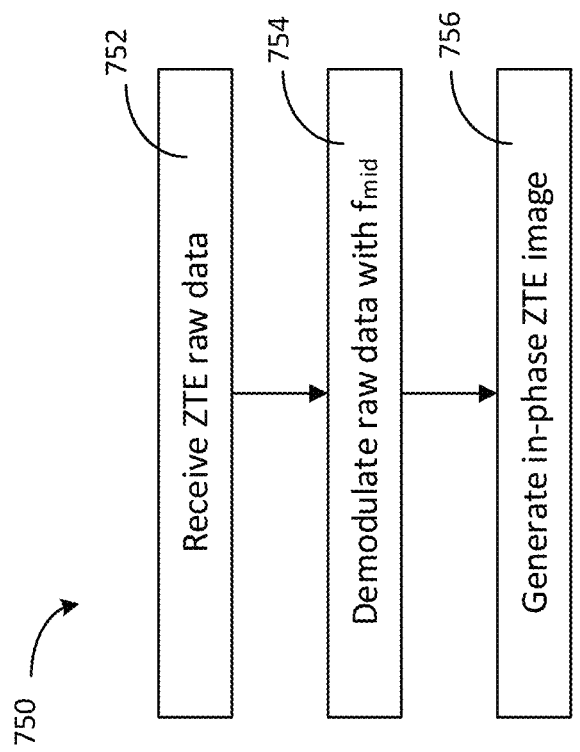
FIG. 7B is a flow chart of a method for reducing out-of-phase cancellation artifact in ZTE MRI, in accordance with another exemplary embodiment.
Figure 7A:
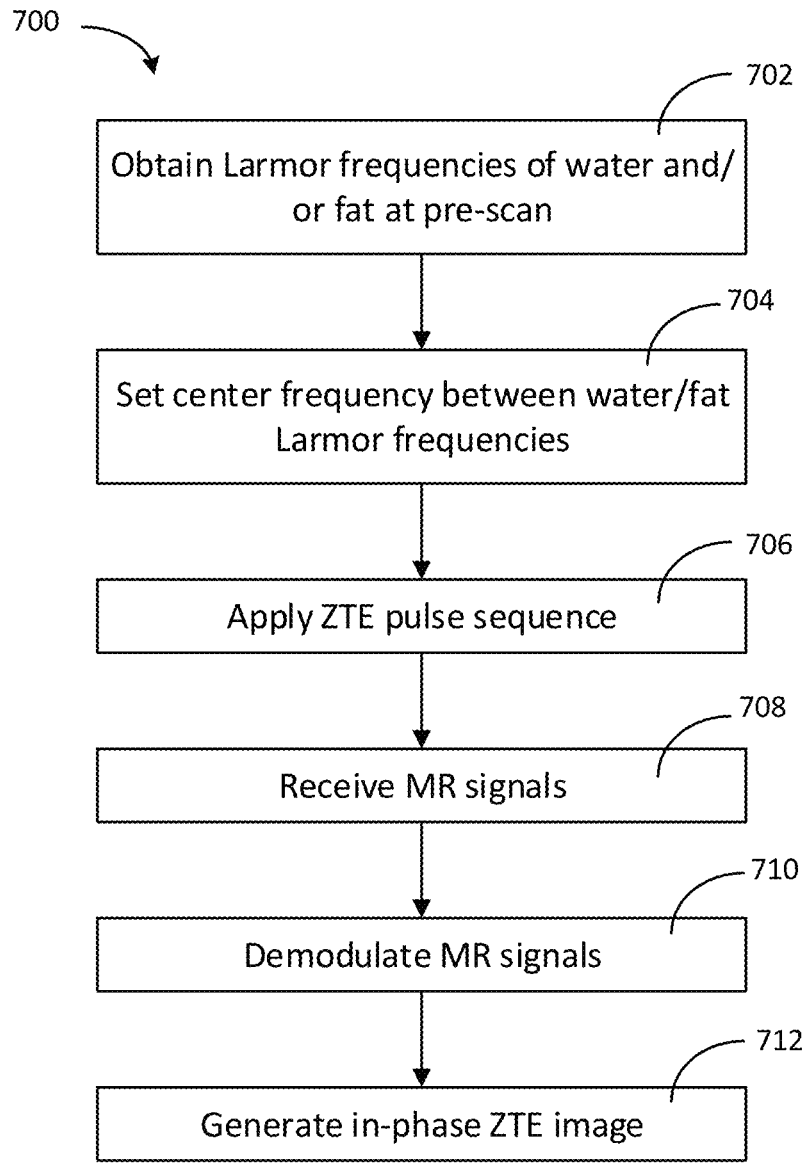
FIG. 7A is a flow chart of a method for reducing out-of-phase cancellation artifact in ZTE MRI, in accordance with an exemplary embodiment.

Referring to FIG. 7A, a flow chart 700 of a method for in-phase ZTE MRI is shown in accordance with an exemplary embodiment. The method can be performed by an MRI system, (e.g., the MRI system 100 in FIG. 1). At operation 702, Larmor frequencies of water and/or fat are obtained for a region of interest of a subject to be imaged at pre-scan. Any appropriate pre-scan sequence may be used to measure the precise Larmor frequencies of water and/or fat. In some embodiments, both Larmor frequencies of water and fat are measured at pre-scan. In some embodiments, one of them is measure and the other may be calculated via known formula.

At operation 704, the center frequency of the RF transceiver of the MRI system is set to a value between the Larmor frequencies of fat and water. One purpose of pre-scan is to optimize characteristics of the RF transceiver, including setting the center frequency of the transceiver to a desired value. In some embodiments, the desired center frequency is the midpoint between the Larmor frequencies of fat and water. In some embodiments, the desired center frequency is substantially the midpoint, for example, midpoint ±25% of the difference of Larmor frequencies of water and fat.

At operation 706, the ZTE pulse sequence is applied to scan the subject. Any appropriate ZTE pulse sequence can be used for acquisition, including but not limited to, RUFIS, BLAST sequence, WASPI sequence, PETRA, RHE, etc., or any combination thereof.

At operation 708, MR signals from the subject in response to the ZTE pulse sequence are received. At operation 710, the received MR signals are demodulated. The frequency for demodulation is the center frequency of the transceiver set at operation 704. At operation 712, in-phase ZTE images are generated from the demodulated MR signals. Any appropriate approach may be used to reconstruct the images, which generally includes Fourier transform of data from k-space to image space.

Referring to FIG. 7B, a flow chart 750 of a method for in-phase ZTE MRI is shown in accordance with another exemplary embodiment. The method may be performed by a processing system, such as a computer system. The computer system may be an image workstation separate from the MRI system. At operation 752, ZTE raw data is received. ZTE raw data refers to the MR signals generated by the subject in response to the ZTE pulse sequence. In some embodiments, the MR signals may be amplified (at pre-amplifier 166 in FIG. 1). The raw data may be received directly or indirectly from an MRI system that performs the ZTE MRI. At operation 754, the raw data is demodulated by a frequency at a value between the water and fat Larmor frequencies. For example, the frequency for demodulation may be the midpoint of water and fat Larmor frequency. At operation 756, in-phase ZTE images are generated from the demodulated MR signals. Any appropriate approach may be used to reconstruct the images, which generally includes Fourier transform of data from k-space to image space.

Figure 8:
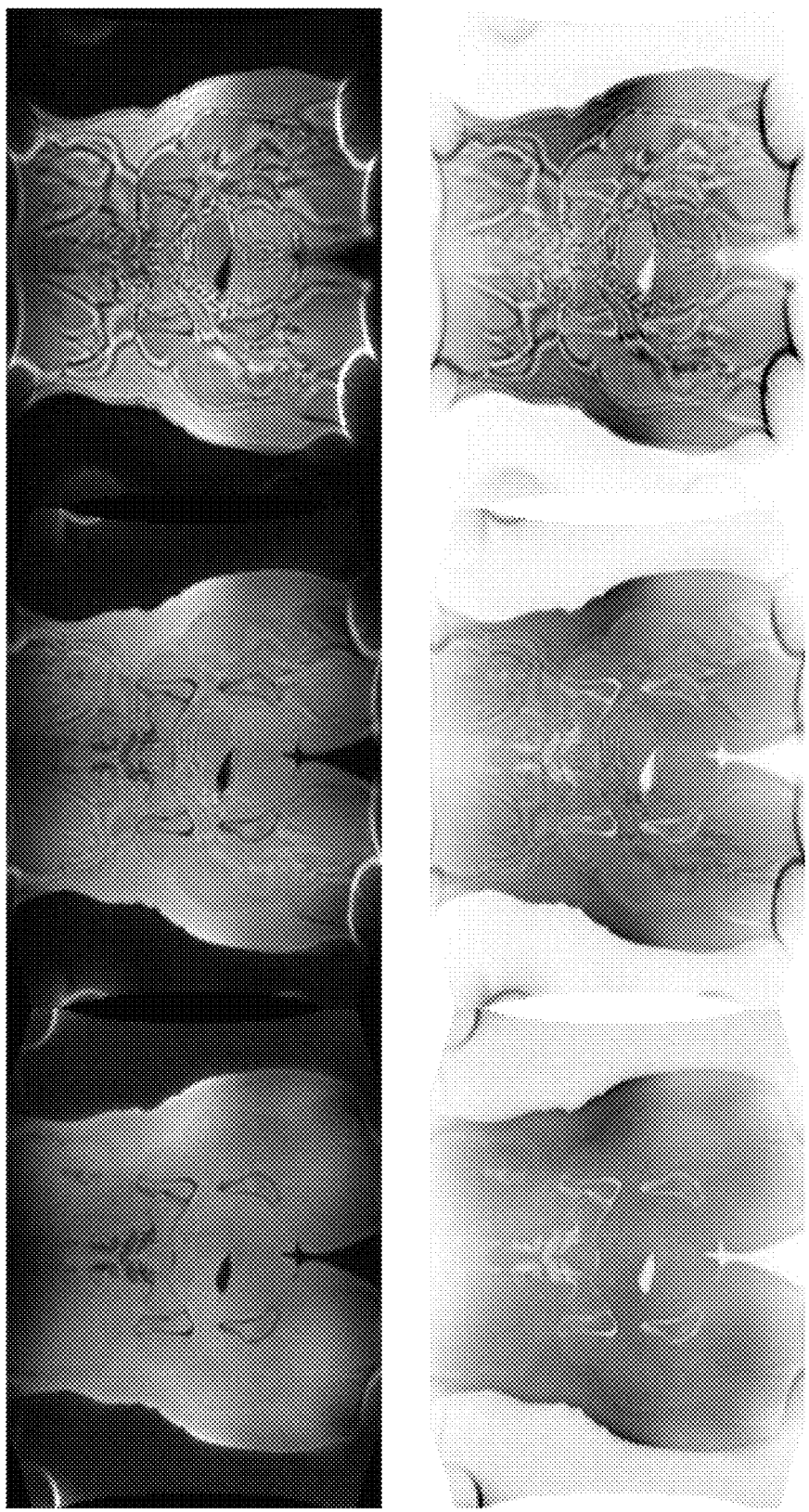
FIG. 8 illustrates fat-water chemical shift effects in the pelvis, in accordance with an exemplary embodiment.

As a result, the in-phase ZTE images obtained according to the methods described in this disclosure demonstrates improved chemical shift off-resonance behavior and correspondingly reduced fat-water out-phase image disturbance. Referring to FIG. 8, fat-water chemical shift effects in the pelvis are illustrated, in accordance with an exemplary embodiment. In FIG. 8, the top row is linear scale and the bottom row is inverted gray scale. Images on the left column are ZTE images acquired with an imaging bandwidth of ±125 kHz; images on the middle column are ZTE images acquired with a bandwidth of ±62.5 kHz; and images on the right column are ZTE images acquired with a bandwidth of ±31.25 kHz. It can be seen that for the highest imaging bandwidth of ±125 KHz, soft-tissue appears uniform, almost like CT, with bones clearly depicted. In comparison, the ZTE images acquired at ±31.25 kHz show substantial out-of-phase artifacts primarily around fat-water interfaces, thereby severely degrading ZTE bone depiction.

Figure 9:
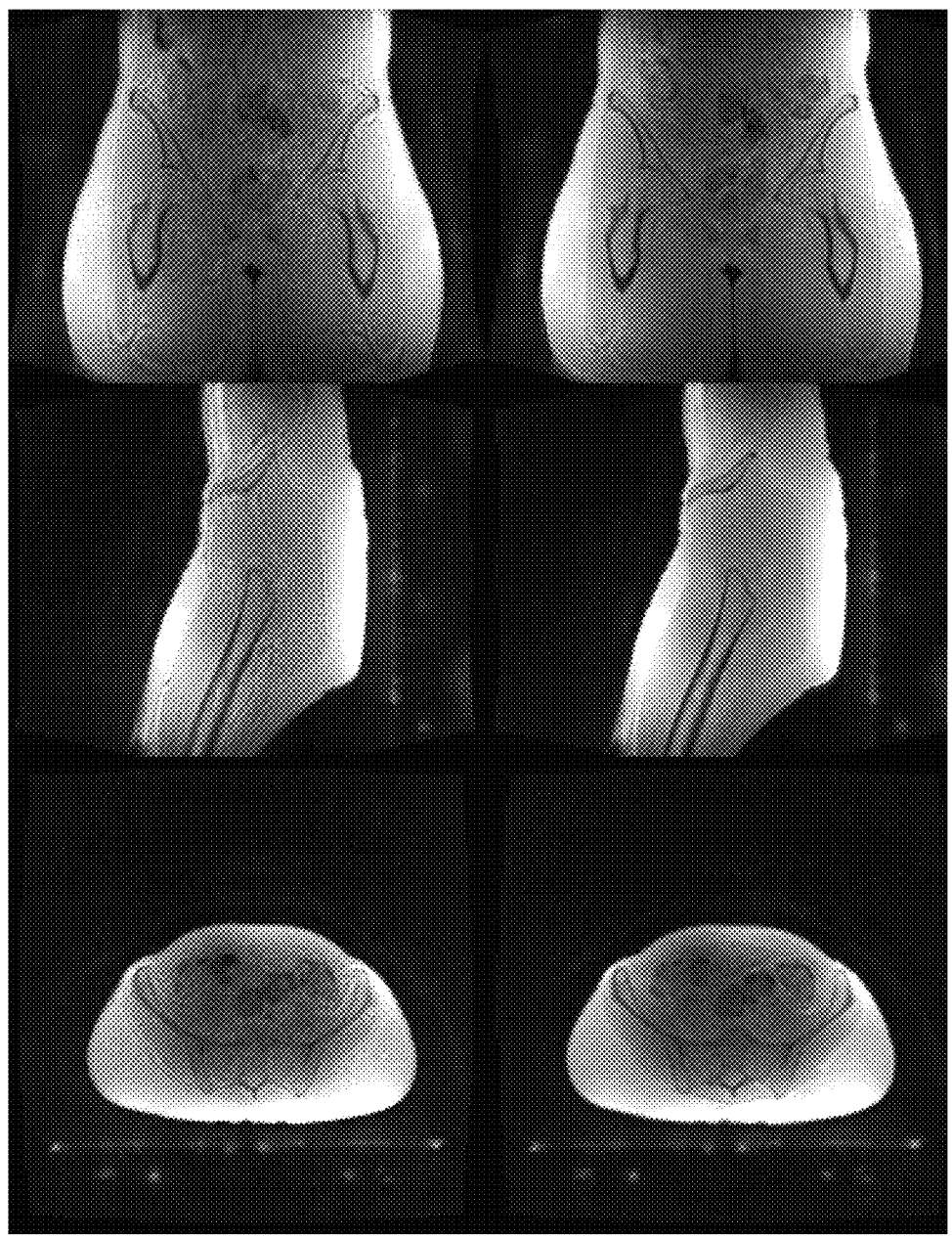
FIG. 9 illustrates in-phase ZTE images by the method disclosed herein compared with images by conventional method, in accordance with an exemplary embodiment.

Referring to FIG. 9, in-phase ZTE images acquired by the method disclosed herein are compared with ZTE images acquired by conventional method, in accordance with an exemplary embodiment. Images on the left column were acquired using conventional method in which the frequency for demodulation is the Larmor frequency of water. Images on the right column were acquired using the method disclosed herein in which the frequency for demodulation is 220 Hz (i.e., half the fat-water chemical shift at 3 T) lower than the Larmor frequency of water. Apparently, the in-phase ZTE images demonstrate significantly reduced out-phase signal artifact.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

What is claimed is:

1. A method for zero echo time (ZTE) magnetic resonance imaging (MRI) performed by a magnetic resonance (MR) system, the method comprising:
   obtaining Larmor frequencies of water and/or fat for a region of interest of a subject to be imaged at a pre-scan;
   setting a center frequency for a radio frequency (RF) transceiver of the MR system at a value between the Larmor frequencies of water and fat;
   applying a ZTE pulse sequence to the subject;
   receiving MR signals in response to the ZTE pulse sequence from the subject;
   demodulating the received MR signals with the center frequency; and
   generating an in-phase ZTE image from the demodulated MR signals.

2. The method of claim 1, wherein setting the center frequency comprises setting the center frequency around a midpoint between the Larmor frequencies of water and fat.

3. The method of claim 1, wherein the center frequency is within a range of the midpoint ±25% of a difference between the Larmor frequencies of water and fat.

4. The method of claim 1, wherein setting the center frequency comprises setting the center frequency about 110 Hz below the Larmor frequency of water while about 110 Hz above the Larmor frequency of fat for a magnetic field of 1.5 Tesla.

5. The method of claim 1, wherein setting the center frequency comprises setting the center frequency about 220 Hz below the Larmor frequency of water while about 220 Hz above the Larmor frequency of fat for a magnetic field of 3 Tesla.

6. The method of claim 1, wherein the ZTE pulse is one of RUFIS sequence, BLAST sequence, WASPI sequence, PETRA sequence, RHE, and combinations thereof.

7. A magnetic resonance imaging (MRI) system comprising:
   a magnet configured to generate a static magnetic field;
   gradient coils configured to generate encoding gradients;
   a radio frequency (RF) transceiver; and
   a processor connected to the magnet, the gradient coils, and the RF transceiver, the processor being configured to:
      instruct the MRI system to perform a pre-scan to obtain Larmor frequencies of water and/or fat in the static magnetic field for a region of interest of a subject to be imaged at a pre-scan; and
      set a center frequency for the RF transceiver at a value between the Larmor frequencies of water and fat;
   wherein the RF transceiver is configured to:
      generate an RF excitation, wherein the RF excitation is applied to the subject while the encoding gradients are active;
      receive MR signals in response to the RF excitation from the subject; and
      demodulate the received MR signals with the center frequency;
   wherein the RF excitation and the encoding gradients form a zero echo time (ZTE) pulse sequence.

8. The MRI system of claim 7, wherein the RF transceiver comprises:
   a frequency synthesizer configured to generate an RF carrier wave at the center frequency; and
   a demodulator configured to demodulate the received MR signals with the center frequency,
   wherein the demodulator receives a copy of the RF carrier wave from the frequency synthesizer.

9. The MRI system of claim 8, wherein the RF transceiver further comprises:
   a modulator configured to modulate the RF carrier wave to generate a modulated RF carrier wave; and
   a transmit attenuator configured to attenuate the modulated RF carrier wave to generate the RF excitation.

10. The MRI system of claim 9, further comprising a transmit coil configured to apply the RF excitation to the subject.

11. The MRI system of claim 8, wherein the RF transceiver further comprises:
   a receive attenuator configured to attenuate the received MR signals;
   a low-pass filter configured to filter the demodulated MR signals;
   an analog to digital converter configured to convert the filtered MR signal into digital signals; and
   a digital quadrature detector configured to generate values reflecting the received MR signals.

12. The MRI system of claim 7, wherein the processor is further configured to reconstruct an in-phase image from the demodulated MR signals.

13. The MRI system of claim 7, wherein the center frequency is within a range of a midpoint of the Larmor frequencies of water and fat ±25% of a difference between the Larmor frequencies of water and fat.

14. The MRI system of claim 7, wherein the static magnetic field is 1.5 Tesla, and wherein setting the center frequency comprises setting the center frequency about 110 Hz below the Larmor frequency of water while about 110 Hz above the Larmor frequency of fat.

15. The MRI system of claim 7, wherein the static magnetic field is 3 Tesla, and wherein setting the center frequency comprises setting the center frequency about 220 Hz below the Larmor frequency of water while about 220 Hz above the Larmor frequency of fat.

16. A method for processing magnetic resonance imaging (MRI) data performed by a computer system, the method comprising:
   receiving k-space raw data obtained by zero echo time (ZTE) acquisition;
   demodulating the raw data with a frequency between Larmor frequencies of water and fat for a region of interest of an imaging subject; and
   generating an in-phase ZTE image from the demodulated raw data.

17. The method of claim 16, wherein the frequency for demodulation is within a range of a midpoint of the Larmor frequencies of water and fat ±25% of a difference between the Larmor frequencies of water and fat.

18. The method of claim 16, wherein the frequency for demodulation is 110 Hz below the Larmor frequency of water while about 110 Hz above the Larmor frequency of fat when the ZTE acquisition is at a 1.5 Tesla magnetic field.

19. The method of claim 16, wherein the frequency for demodulation is 220 Hz below the Larmor frequency of water while about 220 Hz above the Larmor frequency of fat when the ZTE acquisition is at a 3 Tesla magnetic field.

\* \* \* \* \*